(12) United States Patent
Miller et al.

(10) Patent No.: US 8,144,084 B2
(45) Date of Patent: Mar. 27, 2012

(54) ELECTRO-LUMINESCENT DISPLAY DEVICE

(75) Inventors: Michael E. Miller, Honeoye Falls, NY (US); Joseph R. Bietry, Rochester, NY (US); Ronald S. Cok, Rochester, NY (US)

(73) Assignee: Global OLED Technology LLC, Herndon, VA (US)

( * ) Notice: Subject to any disclaimer, the term of this patent is extended or adjusted under 35 U.S.C. 154(b) by 1175 days.

(21) Appl. No.: 11/936,251

(22) Filed: Nov. 7, 2007

(65) Prior Publication Data

US 2009/0115705 A1    May 7, 2009

(51) Int. Cl.
*G09G 3/30* (2006.01)
(52) U.S. Cl. ............. 345/76; 345/82; 315/169.1
(58) Field of Classification Search ............. 345/76–83; 362/559, 800; 315/169.1–169.4
See application file for complete search history.

(56) References Cited

U.S. PATENT DOCUMENTS

| | | | |
|---|---|---|---|
| 6,570,324 B1 | 5/2003 | Tutt et al. | |
| 2005/0185419 A1* | 8/2005 | Holman et al. | 362/561 |
| 2007/0052636 A1* | 3/2007 | Kalt et al. | 345/83 |
| 2007/0091037 A1 | 4/2007 | Lee et al. | |
| 2008/0291140 A1* | 11/2008 | Kent et al. | 345/83 |

* cited by examiner

*Primary Examiner* — Kimnhung Nguyen
(74) *Attorney, Agent, or Firm* — Morgan, Lewis & Bockius LLP

(57) ABSTRACT

An electro-luminescent display includes a first array of light-emitting elements. Each of these light-emitting elements has an optical element. A second array of light-emitting elements also includes a second optical element different from the first. One or more row lines are electrically connected to either light-emitting elements in the first array of light-emitting elements or light-emitting elements in the second array of light-emitting elements. One or more column lines provide a data signal to the first and second array of light-emitting elements. A driver circuit delivers common information to the light-emitting elements in both the first and second arrays in response to a select signal for activating light-emitting elements in the first or second arrays.

20 Claims, 10 Drawing Sheets

ELECTRO-LUMINESCENT DISPLAY DEVICE

FIELD OF THE INVENTION

The present invention relates to electro-luminescent display devices having a low power consumption mode. Specifically, the present invention provides an electro-luminescent display system having an arrangement of micro-lenses, a pixel layout, and a driving method for providing a low-cost display having a switchable low-power, low cost display.

BACKGROUND OF THE INVENTION

Numerous technologies for forming flat-panel displays are known in the art. One such technology is the electro-luminescent display, which is formed by coating a thin layer of electro-luminescent material between a pair of electrodes. Displays employing this technology produce light as a function of the current between the two electrodes when the electro-luminescent materials are electrically stimulated. One of the virtues of EL displays is the fact that they provide near-lambertian light emission. As a result, EL displays emit light over practically a full 180-degree field of view in both the horizontal and vertical dimension. This large angle of light emission is a virtue in that it allows multiple individuals to simultaneously view such a display from multiple viewing positions. It also allows individuals to view such a display without orienting it to one preferred viewing position. Unfortunately, because EL displays often provide luminance over a full 180-degree field of view in all directions, the display must consume enough power to create a high level of illumination at all angles. Therefore, such a display can require more power to create a given level of illumination at a preferred angle than other displays, such as liquid crystal displays, which often emit light over smaller viewing angles.

It is known to apply micro-lenses to EL displays, which focus the light from individual light-emitting elements into narrow cones of light, decreasing the power required to provide a desired level of luminance within the narrow cone of light as compared to an EL display having a very broad viewing angle. For example, Tutt et al., in U.S. Pat. No. 6,570,324, entitled, "Image display device with array of lenslets" describes an organic light-emitting diode display having a sparse array of micro-lenses. Unfortunately these devices sacrifice the normally wide viewing angle that is typical in organic light-emitting diode displays.

Lee, in US Publication 2007/0091037, entitled "Energy efficient compact display for mobile device", discusses the use of a sparse array of micro-lenses together with a much higher density array of light-emitting elements to steer light to the eyes of a user. As such, different light-emitting elements can be selected to steer the light to the eyes of the user, such that the user can perceive the display as having a very large field of view, even though the display only provides a small field of view at any moment. This ability to selectively adjust the field of view of the display allows the power consumption of the display to be reduced by significant amounts by reducing the field of view of the display, while providing the user with a perceptually broad field of view. Unfortunately, such a display requires a large number of individually-addressable light-emitting elements within each pixel. Moreover, with the technology available today, it is not possible to create a high-resolution display having numerous, individually-addressable light-emitting elements within each pixel.

There is a need to provide a display that has the improved power consumption of a narrow-angle display while at the same time, providing the ability to provide a display having a wide viewing angle. Such a display should not require a significantly higher density of light-emitting elements or increase the number or frequency of row and column drivers. Further, the display should not introduce undesirable artifacts.

SUMMARY OF THE INVENTION

The present invention addresses the aforementioned need by providing an electro-luminescent display having a first array of light-emitting elements. Each of these light-emitting elements has an optical element. A second array of light-emitting elements also includes a second optical element different from the first. One or more row lines are electrically connected to either light-emitting elements in the first array of light-emitting elements or light-emitting elements in the second array of light-emitting elements. One or more column lines provide a data signal to the first and second array of light-emitting elements. A driver circuit delivers common information to the light-emitting elements in both the first and second arrays in response to a select signal for activating light-emitting elements in the first or second arrays.

Another aspect of the present invention provides a color electro-luminescent display that includes a two-dimensional array of two or more colors of electro-luminescent light-emitting elements, arranged to be intermixed along a first dimension that is perpendicular to a second dimension. An array of lenses are arranged parallel to the electro-luminescent light-emitting elements in the first dimension and the arrangement has fewer lenses than light-emitting elements when perpendicular to the first dimension.

DETAILED DESCRIPTION OF THE INVENTION

Figure 1:
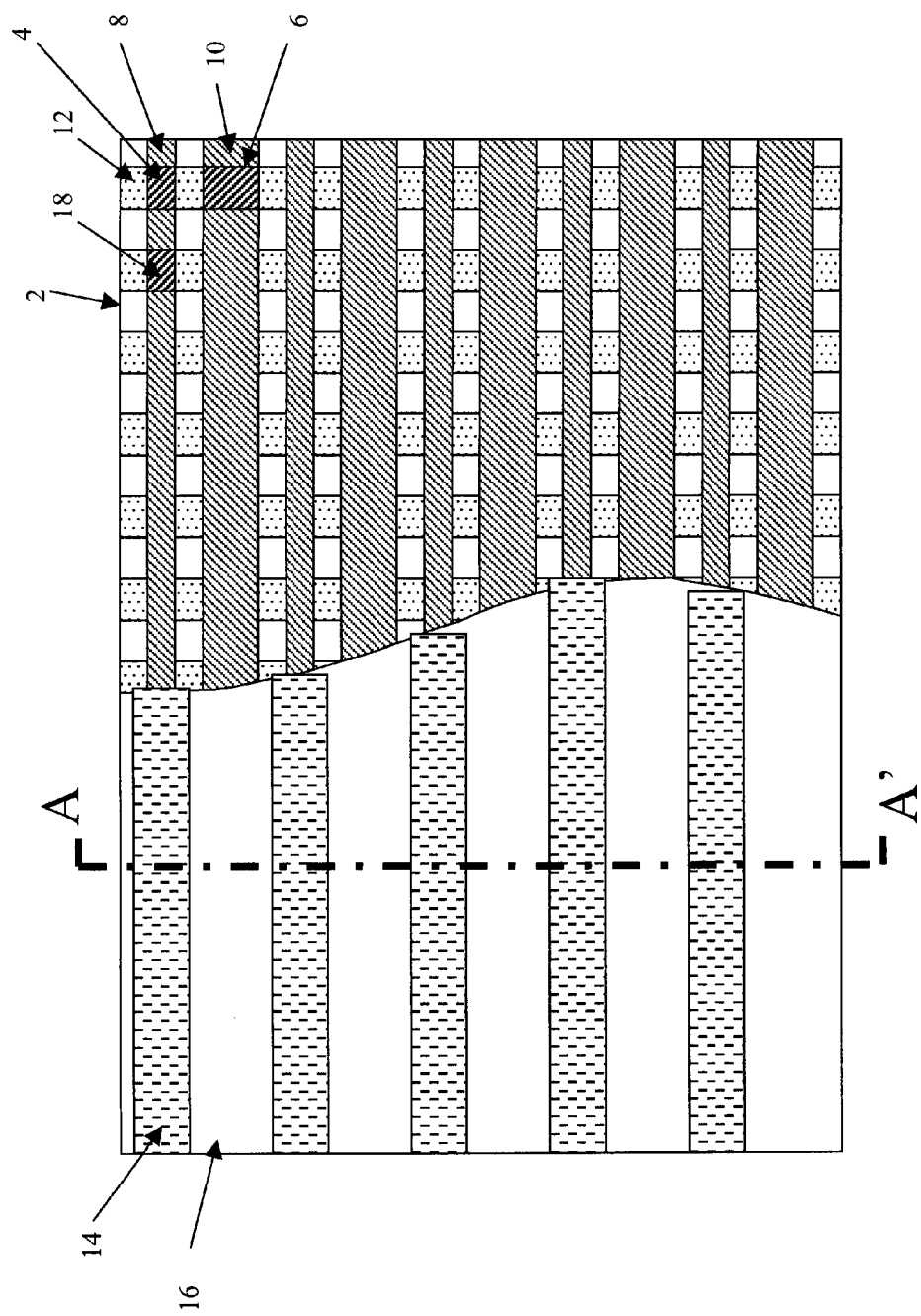
FIG. 1 is a schematic diagram depicting the components of a display useful in practicing the present invention.

The need is met by providing an electro-luminescent display as shown in FIG. 1. Such a display 2, includes a first array of light-emitting elements 4, wherein each of the light-emitting elements within the first array of light-emitting elements include a first optical element 14 for directing the light into a first viewing cone (not shown). The first optical element depicted in FIG. 1 can be a cylindrical lens formed within an overlaying substrate. The display will additionally include a second array of light-emitting elements 6, each of the light-emitting elements including a second optical element 16, different from the first optical element 14. As shown in FIG. 1, optical element 16 can be a plano-surface, which does not direct the light, allowing the light-emitting elements to emit light over a diffuse angle. Therefore, as shown, each of the light-emitting elements within the second array of light-emitting elements 6 emit light over a second viewing cone larger than the first viewing cone. As shown in one embodiment of FIG. 1, the second array of light-emitting elements 6 can emit light such that it passes through a surface that does not contain a first optical element 14, wherein this surface serves as the optical element 16 or perhaps allows the light to pass through an optical element 16, which provides a lower optical power than the optical element 14 which can be a lens.

The electro-luminescent display further includes one or more row lines 8, 10 that are electrically connected to either the light-emitting elements 4 in the first array of light-emitting elements or light emitting elements 6 in the second array of light-emitting elements. The display will also provide one or more column lines 12 for providing a data signal to the first and second arrays of light-emitting elements. Such an electrical arrangement is beneficial as it allows for the simplification of drive electronics and allows further power reductions when presenting a narrow-angle image as will be described.

Figure 3:
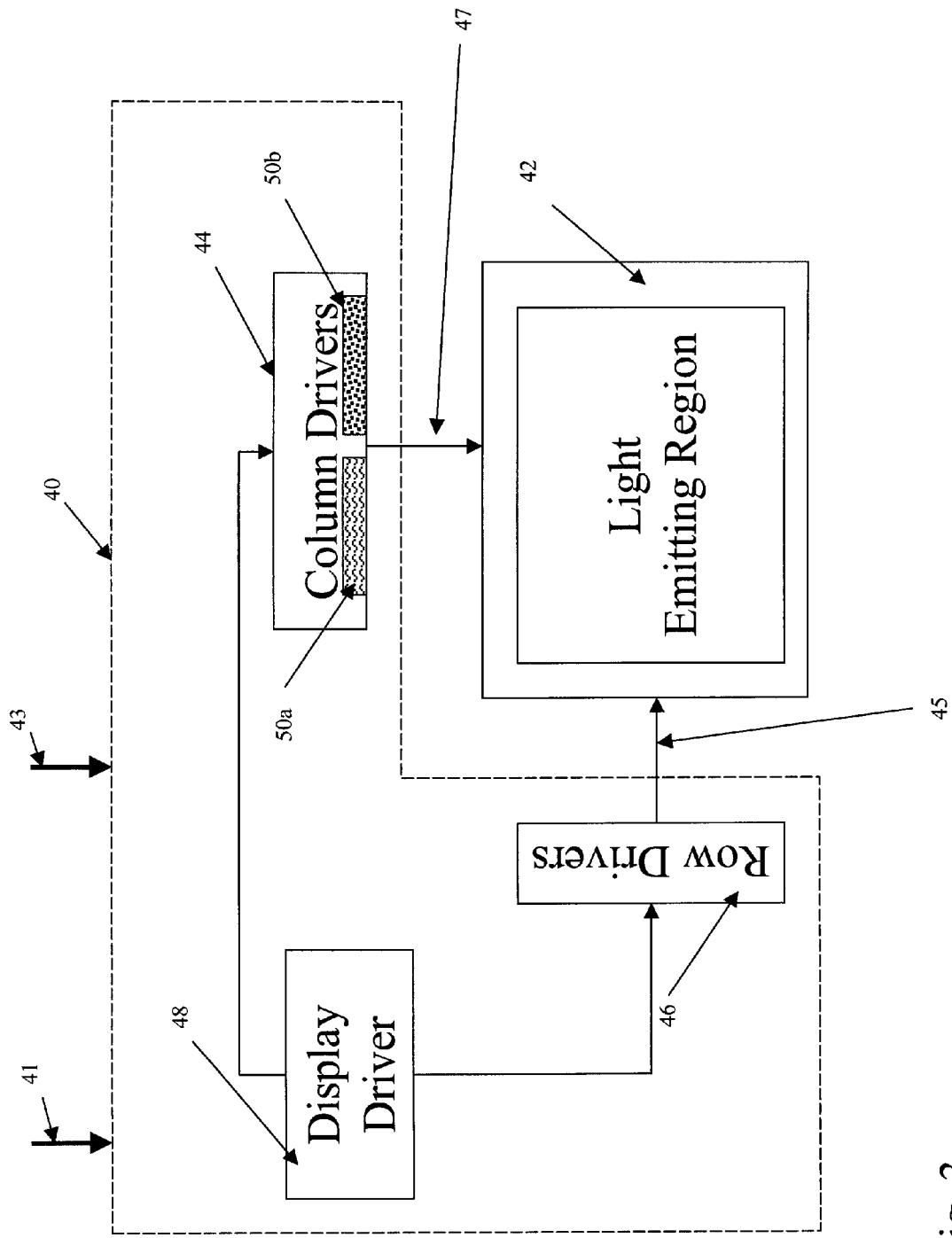
FIG. 3 is a schematic diagram depicting additional components of a display useful in practicing the present invention.

One of the advantages of this display configuration is the ability to selectively enable light-emitting elements in either the first or second arrays of light-emitting elements by selecting a subset of the row electrodes. This allows the display to be addressed while addressing only a subset of the light-emitting elements 4, 6 and therefore reduces the frequencies at which the drive electronics are required to perform. The display of the present invention will, therefore, typically include a driver circuit 40 as shown in FIG. 3 that delivers common information to the light-emitting elements 4,6 in both the first and second arrays in response to a selection signal for activating light-emitting elements in the first or second arrays. The driver circuit 40 can take many forms, but can include the row drivers 46, column drivers 44 and display driver 48 as shown in FIG. 3. Generally, this driver circuit 40 will receive an input image signal 41 and a selection signal 43 from an external source. The selection signal 43 will provide information regarding the combination of first and second arrays of light-emitting elements to be activated. The input image signal 41 will provide code values for implied spatial locations on the display. When rendering this information to the display, the drive circuit 40 will typically render information for one implied spatial location to both a light-emitting element 4 within the first array of light-emitting elements and a light-emitting element 6 within the second array of light-emitting elements to deliver common information to the light-emitting elements 4,6 within the first and second arrays of light-emitting elements. As shown in this figure, the row driver will receive a signal from the display driver 48 and will provide a select signal 45 to select among the one or more row lines 8,10 that are electrically connected to either light-emitting elements 4 in the first array of light-emitting elements or light-emitting elements 6 in the second array of light-emitting elements. Synchronously, the column drivers 44 will receive a signal from the display driver and will provide a voltage or current signal 47 to the light-emitting elements in the first and second arrays of light-emitting element to provide common information to light-emitting elements within the two arrays of light-emitting elements.

This signal 47 for providing common information will typically be provided by receiving an input code value, target voltage, or current and subjecting this value to the same or different look-up table operation, depending upon whether the signal is intended to be provided to a light-emitting element 4 within the first array of light-emitting elements or a light-emitting element 6 within the second array of light-emitting elements. It should be noted that this common information can direct the light-emitting elements 4,6 within the first and second arrays of light-emitting elements to have a common color of light output and will typically allow the light-emitting elements to have the same luminance relative to other light-emitting elements within their arrays. However, the light-emitting elements will not typically produce the same absolute luminance. That is, the ratio of luminance between the luminance produced by a light-emitting element within one of the arrays to the luminance of the light-emitting element when driven to its maximum value can be the same, but the light-emitting elements within the first and second arrays will typically be different. It can also be recognized that although the driver circuit can deliver common information to the light-emitting elements to the first and second arrays of light-emitting elements, commonly used algorithms, such as subpixel interpolation can adjust these values slightly to adjust the drive signal for the offset in spatial location of the light-emitting elements.

Because the driver circuit 40 delivers common information to the light-emitting elements in both the first and second arrays, and more precisely delivers common information to pairs or groups of light-emitting elements within both the first and second arrays that represent the same spatial location within the displayed image, it is desirable that the user not be able to distinguish between or among pairs or groups of light-emitting elements within the first or second arrays that are intended to represent the same spatial location within the displayed image. Therefore, it is desirable that the light-emitting elements within the first and second arrays of light-emitting elements, which are driven with the common information are not spatially resolvable from a viewing distance of about four times the height of the display. This will typically be accomplished by having pairs or groups of light-emitting elements within the first and second arrays of light-emitting elements which receive common information that do not subtend a visual angle greater than about 1.2 minutes of visual angle when viewed from a distance of about four times the height of the display.

Figure 2:
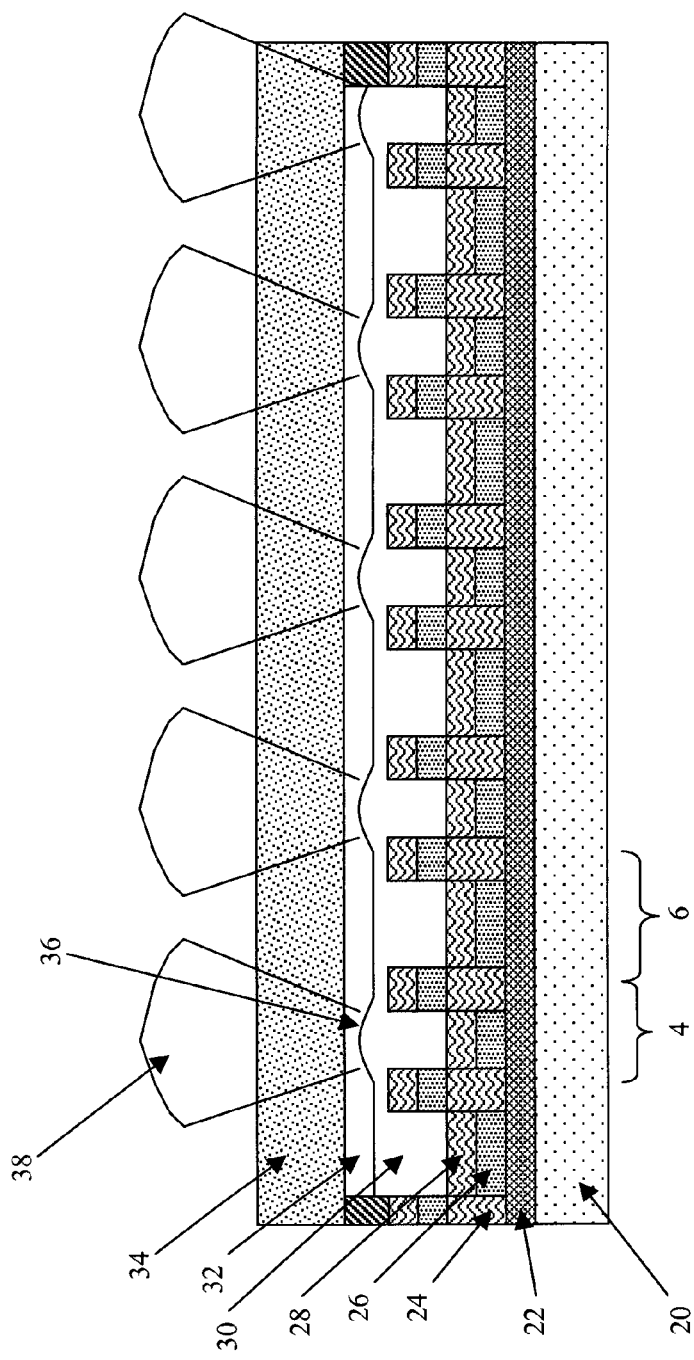
FIG. 2 is a cross sectional view of a passive matrix, electro-luminescent display useful in practicing the current invention.

To further understand such an embodiment, FIG. 2 depicts a cross-section of a passive matrix electro-luminescent display according to an embodiment of the present invention. This cross-section is taken from the line A-A' of FIG. 1. As shown in this diagram, the electro-luminescent display will typically include a substrate 20. A conductive layer 22 will be deposited on this substrate and patterned to form column lines 12. Within passive-matrix displays, these column lines 12 typically serve both to deliver power to the light-emitting elements 4, 6 and as electrodes, typically anodes, for the individual light-emitting elements 4, 6.

An insulating barrier layer 24 will often be deposited and patterned to form a patterned structure providing valleys that are perpendicular to the column lines 12. This insulating barrier layer 24 serves to pattern subsequent deposition layers into lines orthogonal to the column lines 12. Over this patterned, insulating barrier layer 24, an electro-luminescent layer 26 will be deposited. This electro-luminescent layer 26 will often be composed of a multi-layer structure that can include hole and electron injection materials, hole- and electron-transport materials, hole- and electron-blocking layers, and light-emitting layers. A second conductive layer 28 is deposited to serve as a second electrode, often the cathode, for the individual light-emitting elements. Thin-film encapsulation layers (not shown) can optionally be further provided over this conductive layer 28. An air gap 30 or a layer of low optical-index material (e.g., material having an index of refraction close to 1 and typically 1.2 or less) is provided next. A second substrate 34 is subsequently provided within the structure and a patterned layer 32 providing the lens elements 14 will be attached to substrate 34. Patterned layer 32 can be formed directly on the second substrate 34 using processes well known in the art or can be first formed as an optical film and attached to the second substrate 34. The patterned layer 32 can be formed on either side of the substrate, but can be afforded physical protection and located closer to the light-emitting surface; allowing for better access to the light that is generated by the electro-luminescent layer 26, when formed on the inside of the second substrate 34, as is shown in FIG. 2. As shown in this figure, functional lenses 36 are formed in the patterned layer 32, which can serve as the first optical elements 14 and are aligned with the light-emitting elements 4 within the first array of light-emitting elements. These functional lenses 36 direct the light from the light-emitting elements 4 within the first array of light-emitting elements into a narrow cone of light 38. However, as shown in FIG. 2, the patterned layer can be flat in the regions corresponding to the light-emitting elements 6 within the second array of light-emitting elements, forming a plano lens, which serves as the second optical elements 16. These optical elements, therefore, do not narrow the viewing angle of the emitted light. In alternative embodiments, lenses can be formed over both the light-emitting elements 4 within the first array of light-emitting elements and the light-emitting elements 6 within the second array of light-emitting elements, as long as the optical power of the lenses 36 are aligned with the light-emitting elements 4 within the first array of light-emitting elements is higher than the optical power of the lenses (not shown) which would be aligned with the light-emitting elements 6 within the second array of light-emitting elements.

As noted earlier, the display will further include a driver circuit 40 as shown in FIG. 3. This driver circuit can further include row drivers 46 and column drivers 44 that are connected to the row lines 8 and column lines 10 within the light-emitting region 42 as depicted in FIG. 1. In this embodiment, the row drivers select the row lines 8, 10 within the array of row lines to allow the light-emitting elements 4, 6 to receive a signal provided by the column drivers 44 on the column lines 10. Driver circuit 40, and more specifically, the row drivers 46 are capable of switching between two modes of operation. In the first mode of operation, only the row lines 8 within the array of row lines forming a connection to the light-emitting elements 4 within the first array of light-emitting elements are selected. As such, the column drivers 44 only provide drive signals to the light-emitting elements 4 within the first array of light-emitting elements to update the display. In the second mode of operation only the row lines within the array of row lines 10 forming a connection to the light-emitting elements 6 within the second array of light-emitting elements are selected when driving the display. Therefore, the column drivers 44 must only provide drive signals to the light-emitting elements 6 within the array of light-emitting elements. The arrangement of row lines, wherein each row line 8, 10 is connected to only light-emitting elements 4 within the first array of light-emitting elements or light-emitting elements 6 within the second array of light-emitting elements, therefore, allows the column drivers 44 to provide data at a rate that is necessary to update the larger of the two arrays of light-emitting elements, or for a display as depicted in FIG. 1 in which there are equal numbers of light-emitting elements within the first and second arrays of light-emitting elements, the column drivers must only provide data at a rate that is half the rate necessary to drive all of the light-emitting elements of the display. Since, higher speed column drivers are typically more expensive or at times are not available due to technology limitations, the arrangement of row lines as discussed in the present invention enables the use of lower-cost column drivers or enables the manufacture of higher resolution displays, which have more than one type of pixel for presenting images having two or more fields of view.

As noted in the previous paragraph, it is not necessary that the first and second arrays of light-emitting elements contain the same number of light-emitting elements. Therefore, embodiments will exist that, even if the two arrays of light-emitting elements are to be refreshed at the same speed it will be desirable for the row lines forming an electrical connection to light-emitting elements 4 within the first array of light-emitting elements to have a different electrical impedance from the row lines forming an electrical connection to the light-emitting elements 6 within the second array of light-emitting elements. Further, particularly in passive-matrix embodiments, it can be desirable for the row lines that are electrically connected to the light-emitting elements 4 within the first array of light-emitting elements to be narrower, and therefore have a different impedance, than the row lines that are electrically connected to the light-emitting elements 6 within the second array of light-emitting elements.

Figure 4:
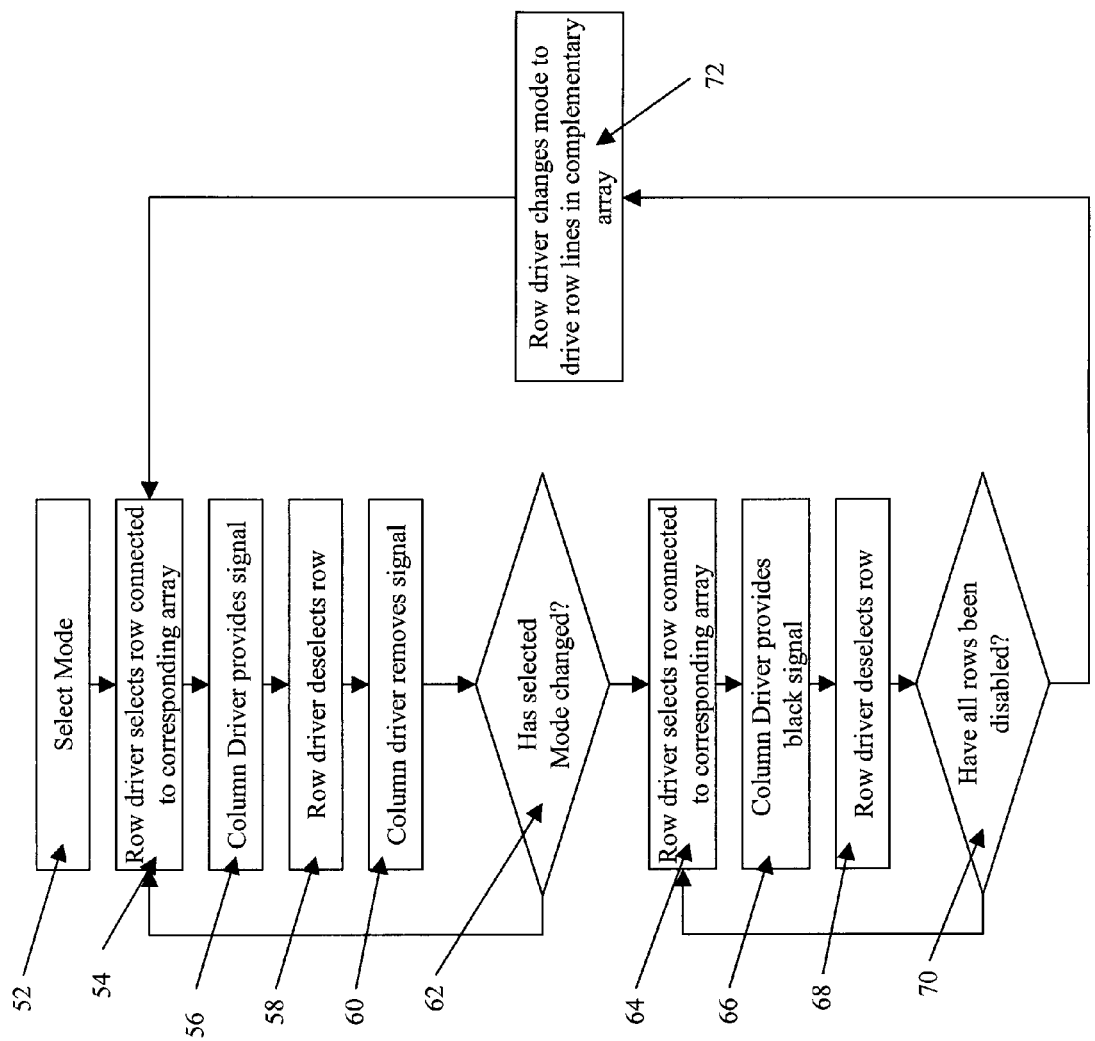
FIG. 4 is a flow diagram depicting the method useful in driving a display of the present invention.

In the embodiment as just described, the row and column drivers drive the display as shown in FIG. 4. First one of the two modes will be selected 52 in response to a selection signal 43. In reaction, the row drivers provide 54 a signal to one or more row lines within the array of row lines that are connected to either the first or second array of light-emitting elements. The column drivers 56 provide a signal to the column lines to provide a signal to the light-emitting elements that are connected to the selected row lines. The row drivers deselect 58 the row lines; the column drivers remove 60 the signal and the row drivers select 54 the next row line or row lines and the process repeats, until a second one of the two modes is selected 62 as indicated by a change in the selection signal 43. At this point, the row driver can, particularly in an active matrix display, select 64 each row line one more time and the column driver 66 can provide a signal to de-active each of the active light-emitting elements. The row driver can then deselect 68 the row. This will continue until it is decided 70 that all of the rows have been deselected. The row driver changes the mode 72 to drive the row lines that are electrically connected to the complementary of the first or second arrays of light-emitting elements. It should be noted that in a passive-matrix display, it will not be required that the column driver de-activate each light-emitting elements as indicated in steps 64 through 70 as these light-emitting elements are typically only active while the column driver provides a signal. Once the row driver changes 72 mode, the row drivers begins to select the row lines that are connected to the light-emitting elements that are to be activated in the second of the two modes, and the column drivers provides signals to the column lines to illuminate the light-emitting elements within the complementary array of light-emitting elements.

For some embodiments, these two modes can be all that are required, as switching between them allows the display of either a narrow angle, highly power-efficient mode of operation, or a wide-angle, but less power-efficient mode of operation. However, it is also possible to operate the display in a third mode in which the driver circuit selects all of the one or more row lines to drive all of the light-emitting elements 4, 6 within the display 2, without increasing the frequency of the column drivers 44 by decreasing the update rate of the display. In such an embodiment, row 46 and column 44 drivers provide signals to update the display with a first refresh rate when driving the display in either the first or second mode of operation, as just discussed. However, row 46 and column 44 drivers can also support a third mode of operation in which both the row lines within the array of row lines 8, forming a connection to the light-emitting elements 4 within the first array of light-emitting elements, and the row lines 10, forming a connection to the light-emitting elements 6 within the second array of light-emitting elements, are selected. However, in this mode, row 46 and column 44 drivers provide signals to update the display with a second refresh rate that is lower than the first refresh rate. One method that can be used to do this is to simply switch between the first and second modes after completing the update of each of the row lines 8, 10 that are connected to the light-emitting elements 4, 6 of either the first or second array of light-emitting elements. Within these conditions, the driver circuit will update the display with a first refresh rate when driving the display in either the first or second mode of operation and a second refresh rate when driving the display in the third mode of operation by applying a second refresh rate that is lower than the first refresh rate.

Figure 5:
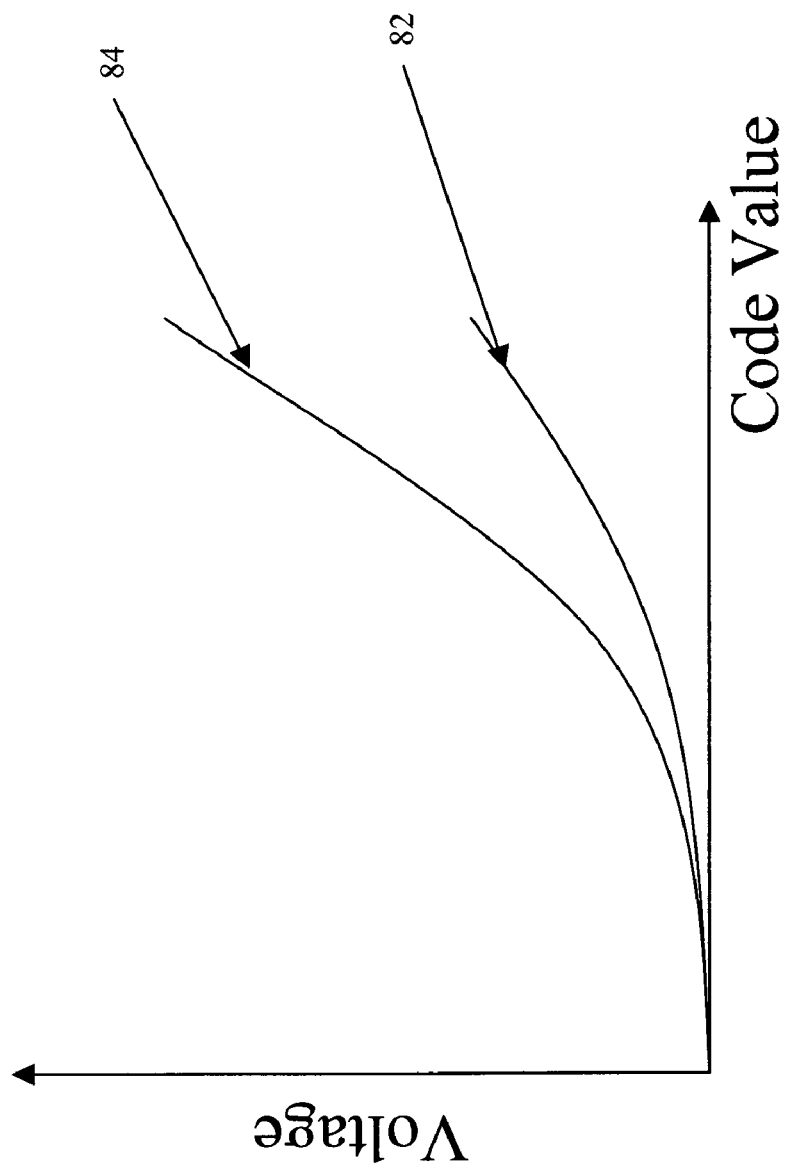
FIG. 5 is a plot depicting a pair of look-up tables, which can be usefully employed in a column driver that is useful in practicing the present invention.

Note that within this embodiment, the light-emitting elements 4 within the first array of light-emitting elements do not only have a narrower field of view, but because they provide light to a smaller angle, they have a higher luminance efficiency for generating light normal to the display 20 substrate. Under many circumstances, it will be desirable for the display 2 to generate nearly equal luminance normal to the display, regardless of the mode in which the display is being operated. Therefore, it is desirable to drive the display such that the peak radiant flux output by light-emitting elements 4 within the first array of light-emitting elements is less than the peak radiant flux output by the light-emitting elements 6, within the second array of light-emitting elements. It should, however, be noted that in some embodiments, it can be desirable for light-emitting elements 4, 6 of one of the first and second arrays of light-emitting elements to output a higher luminance than the other. For example, in one system, an ambient sensor can be provided with the display and the mode of operation can be switched in response to this signal from the ambient sensor. For example, under very high ambient light conditions, the first mode can be activated. Under such a circumstance, it is desirable that the luminance of light-emitting elements 4 within the first array of light-emitting elements, normal to the substrate, be significantly higher than the luminance of light-emitting elements 6 within the second array of light-emitting elements, measured normal to the substrate. Regardless, because of the differences in luminance or luminance efficiency, it's often necessary for the column driver to provide a different range of values when driving light-emitting elements 4 of the first array of light-emitting elements as opposed to the range of values when driving light-emitting elements 6 of the second array of light-emitting elements. To accomplish this without loss of bit depth, the column drivers 44 includes at least two digital-to-analog conversion paths, and wherein the column drivers 44 apply a first analog conversion path when the row driver 46 selects a row line within the array of row lines forming a connection to the light-emitting elements 4 within the first array of light-emitting elements, and a second analog conversion path when the row driver 46 selects a row line within the array of row lines forming a connection to the light-emitting elements 6 within the second array of light-emitting elements. In one embodiment, the first analog conversion path includes a look-up table 50a having a response 82, as shown in FIG. 5 between input digital code value and the analog voltage output by the column driver while the second analog conversion path can include a look-up table 50b having a response such as 84 between input digital code value and the voltage output by the column drivers. Note that in such an embodiment, the column driver provides a higher voltage for the same input digital code value when using the second analog conversion path, such that the total radiant flux of the light-emitting elements 6 is higher than the total radiant flux of the light emitting elements 4 when the first analog conversion path is applied.

In passive-matrix electro-luminescent displays, such as are shown in FIG. 1 and FIG. 2, row 46 and column 44 drivers provide voltage- or current-drive signals to the row 8, 10 and column 12 lines to power the light-emitting elements 4, 6 of the display 2. In these passive-matrix displays, the row 46 and column 44 drivers provide a smaller current to the row 8, 10 and column 12 lines when the row driver 46 selects row line 8, than they provide to the row 10 and column 12 lines when the row driver 46 selects row line 10 to allow the light-emitting elements 4, 6 of the first and second arrays of light-emitting elements to emit similar luminance values when measured normal to the substrate 20. Further, when driving passive-matrix displays, row driver 46 selects either one or multiple row lines simultaneously. For some embodiments of the present invention, when the multiple row lines are selected, these multiple row lines will include row lines 8 or row lines 10. However, the multiple, simultaneously-selected, row lines typically will not simultaneously include row lines 8 that form an electrical connection the light-emitting elements 4 of the first array of light-emitting elements and the row lines 10 that form an electrical connection to the light-emitting elements 6 of the second array of light-emitting elements.

Returning again to FIG. 1, this display includes horizontal rows of light-emitting elements, which emit multiple colors of light to create a full-color display. Each row line, for example, row line 8, is connected to light-emitting elements for producing at least two colors of light. That is light-emitting element 4 produces a first color of light while the light-emitting element 18 produces a second color of light. Additional light-emitting elements within this row produce additional colors of light. As shown in FIG. 1, lens element 14 shapes the light emitted by light-emitting elements for producing multiple colors of light. Specifically, if lens element 14 is a one dimensional lens element, having optical power only in the axis perpendicular to the row of light-emitting elements, the electro-luminescent display is a color display including an array of two or more colors of electro-luminescent light-emitting elements, arranged to be intermixed along a first dimension and having a predetermined density along a second dimension. Alternatively, lens element 14 is an array of one-dimensional lenses, wherein the axis of the lens power is oriented along the second dimension and wherein the density of the one-dimensional lenses is less than the density of the light-emitting elements along the first dimension. This arrangement is desirable, since multiple colors of light-emitting elements are formed under a single optical structure in a way that the multiple colors of light are mixed in the axis parallel to the row lines 8, and therefore do not provide color fringing, which is common when multiple colors of light-emitting elements are formed under a single two-dimensional lens. To employ this arrangement where the lenses are horizontal linear lenses, often referred to as lenticules, the light-emitting elements within the array of light-emitting elements should be arranged within non-overlapping rows such that each row, or horizontal slice, across the display includes only light-emitting elements within either the first array of light-emitting elements or the second array of light-emitting elements. Further, each row of light-emitting elements within the first array of light-emitting elements share a common micro-lens having optical power in the axis perpendicular to the horizontal slice across the display, but not along the axis parallel to the horizontal slice across the display. Another desirable attribute of the display, shown in FIG. 1, is that either array of light-emitting elements are formed from differently colored, light-emitting elements and arranged to form stripes of a common color along one dimension of the display and the one-dimensional lens is oriented such that the long axis of the lens is orthogonal to each stripe. Further, the light-emitting elements include rows of light-emitting elements having a first size in the first dimension and rows of light-emitting elements having a second size in the first dimension; and wherein the rows of light-emitting elements having the smaller of the first and second size in the first dimension are located under the one-dimensional lenses. Further, the display includes an array of row lines oriented parallel to the array of one-dimensional lenses and the array of row lines include a first subset, which provide power to electro-luminescent light emitting elements imaged through the array of one-dimensional lenses; and a second subset which provide power to electro-luminescent light emitting elements that are not imaged through the array of one-dimensional lenses. In this configuration, a color electro-luminescent display is provided that is comprised of a two-dimensional array of two or more colors of electro-luminescent light-emitting elements, arranged to be intermixed along a first dimension that is perpendicular to a second dimension and an array of lenses arranged parallel to the electro-luminescent light-emitting elements in the first dimension. Said arrangement of lenses employs fewer lenses than light emitting elements when perpendicular to the first dimension. In this configuration, the light-emitting elements are formed from arrays of two or more, typically 3 or 4 stripes of a common color that are oriented perpendicular to the first dimension.

Figure 6:
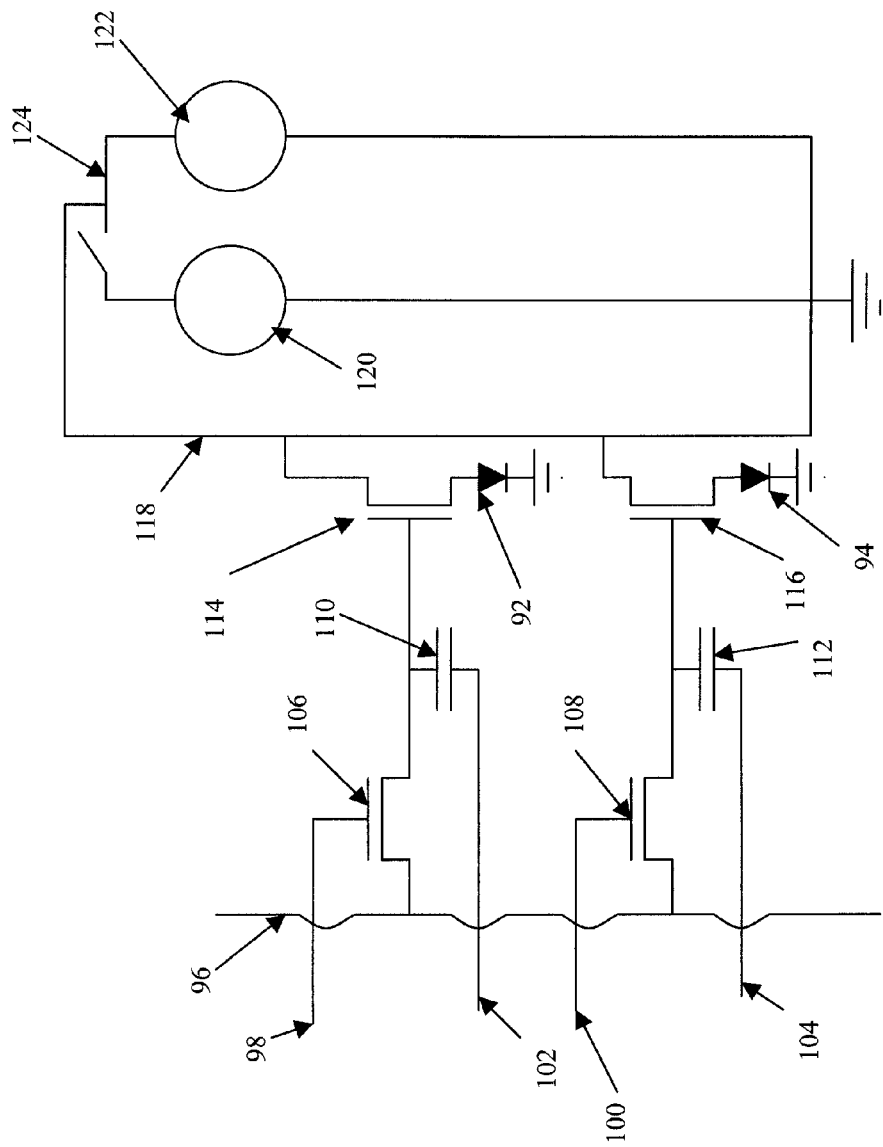
FIG. 6 is a circuit diagram for a pair of active matrix circuits useful in providing power to a pair of light-emitting of the present invention.

Although the device shown in FIG. 1 was a passive-matrix electro-luminescent display, devices according to the present invention can also be formed using active matrix technology to form an active-matrix electro-luminescent display. FIG. 6 provides a circuit diagram for active-matrix circuits useful in controlling a light-emitting element 92 within the first array of light-emitting elements, as well as a light-emitting element 94 within the second array of light-emitting elements. As shown, these two light-emitting elements 92, 94 share a common column line 96, in this instance, a data line. However, the two light-emitting elements 92, 94, each have their own row line 98 and 100, respectively, for selecting the light-emitting element to receive a signal from the column line 96. As shown, each of the two light-emitting elements also has its own capacitor lines 102, 104, arranged in the row direction. Otherwise, in this instance, the circuits for the light-emitting elements of the first and second arrays of light-emitting elements are commonly arranged. The circuits are designed such that when a signal is placed on the row lines 98 or 100 to select the light-emitting element, a data signal can be provided on the column line 96 through one of the select thin-film transistors 106, 108 to charge one of the capacitors 110, 112. Once the capacitor is charged, the signal is removed from the row line 98,100 and the data signal can be changed on the column line 96, without affecting the voltages or currents within this circuit. Once a charge is accumulated on at least one of the capacitors 110, 112, a voltage is provided at the gate of the power thin-film transistors 114, 116 which controls the flow of current from the power line 118 through one or both of the light-emitting elements 92, 94.

Also, shown in FIG. 6 are at least two power supplies 120, 122 that can be optionally connected to the power line 118, through switch 124 to allow the voltage or current provided on the power line to be selected. Since the light-emitting elements 92 within the first array of light-emitting elements will be more power efficient than the light-emitting elements 94 of the second array of light-emitting elements, these light-emitting elements will require lower peak currents, and therefore lower peak voltages. Therefore, when the display is being operated in the first mode, it is desirable that a lower peak voltage be provided on the power line 118 than when the display is being operated in the second mode, as this lower voltage translates to still lower overall power consumption. Therefore, it is desirable that in addition to the arrays of row and column lines as required within the present invention, that the display include an array of power lines 118 that are connected to one or more power supplies 120, 122 capable of providing at least two voltage levels. The power supply voltage is switched between the two voltage levels synchronously, with the switching occurring between the first and second modes by the row drivers. When a lower voltage is used in conjunction with the higher efficiency light-emitting elements, an even lower power consumption results.

Figure 7:
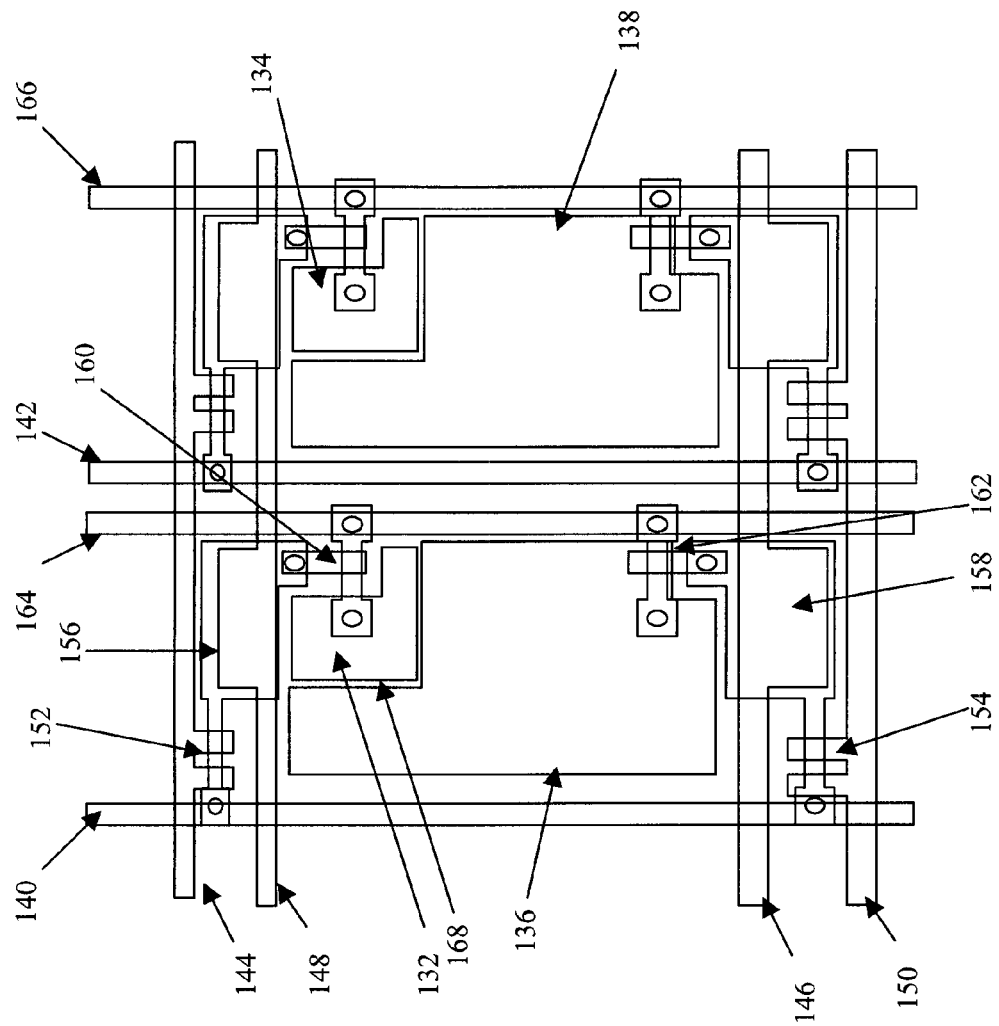
FIG. 7 is an active matrix back plane layout useful in an active matrix display of the present invention.

FIG. 7 shows a portion of an active-matrix backplane layout that applies the circuits shown in FIG. 6. This figure includes circuits for a group of four light-emitting elements. Included are one of the electrodes 132, 134 (i.e., either the anode or cathode), which define the area of two light-emitting elements within the first array of light-emitting elements and one of the electrodes 136, 138 that define the area of two light-emitting elements within the second array of light-emitting elements. As shown, the defining electrodes 132, 134, and therefore the area of the light-emitting elements within the first array of light-emitting elements, are smaller than the defining electrodes 136, 138, and therefore, the area of the light-emitting elements within the second array of light-emitting elements. The relatively small size of the light-emitting elements within the first array of light-emitting elements improves the extraction of light from these light-emitting elements by the lens arrays. Further, since the power efficiency of the light-emitting elements within the first array of light-emitting elements will be higher, a smaller area is required to provide equal current density to the light-emitting elements within the first and second arrays of light-emitting elements, which can help to equalize the lifetime of light-emitting elements within these arrays.

Also shown in FIG. 7 are the column lines 140, 142, the row lines 144, 146, the capacitor lines 148, 150 and the power lines 164, 166. Note that within this embodiment, the row and capacitor lines 144, 148, which are connected to the light-emitting elements within the first array of light-emitting elements, are smaller than the row and capacitor lines 146, 150 that are connected to the second array of light-emitting elements. Although not required, the size of the lines 144, 148 can be reduced slightly due to the need for lower peak voltage as compared to the lines 146, 150. Further, the thin-film transistors 152, 160, and especially capacitor 156, which are connected to light-emitting elements within the first array of light-emitting elements can be smaller than the thin-film transistors 154, 162, and capacitor 158, which are connected to the light-emitting elements within the second array of light-emitting elements. These differences in size are again attributable to lower voltage requirements. However, the ability to employ smaller capacitors and transistors allows the aperture ratio of the light-emitting elements to be maximized within bottom-emitting designs. It should also be noted that the power lines 164, 166 can be sized to allow only the light-emitting elements within the first or second array of light-emitting elements to be operated independently of one another; or can be designed wider such that both arrays of light-emitting elements can be operated simultaneously.

Although the transistors and the capacitor are shown at the top and bottom of the light-emitting elements in FIG. 7, they can also be laid out into other regions. It can be desirable within embodiments of the present invention to create a gap between the light emitting portions of the light-emitting elements defined by electrodes 132, 134 and the light-emitting elements defined by electrodes 136, 138. To accomplish this, the pixel can be laid out such that transistors 152, 160 or capacitor 156 are positioned within the gap 168 between the electrodes 132 and 136, while transistors 154, 162 and capacitor 158 are located between the rows of light-emitting elements as shown. Such an arrangement provides a gap between light-emitting regions over which the edges of two-dimensional lenses can be located. It should be noted that horizontal and vertical regions of the display include a light-emitting element from the first and second arrays of light-emitting elements. Therefore, it is useful to utilize two-dimensional micro-lenses, having optical power in both the horizontal and vertical axes of the electro-luminescent display. As such, the micro-lenses within the light-emitting elements of the first array of light-emitting elements are arranged within a two-dimensional array. These lenses have optical power along at least a horizontal or a vertical axis.

Figure 8:
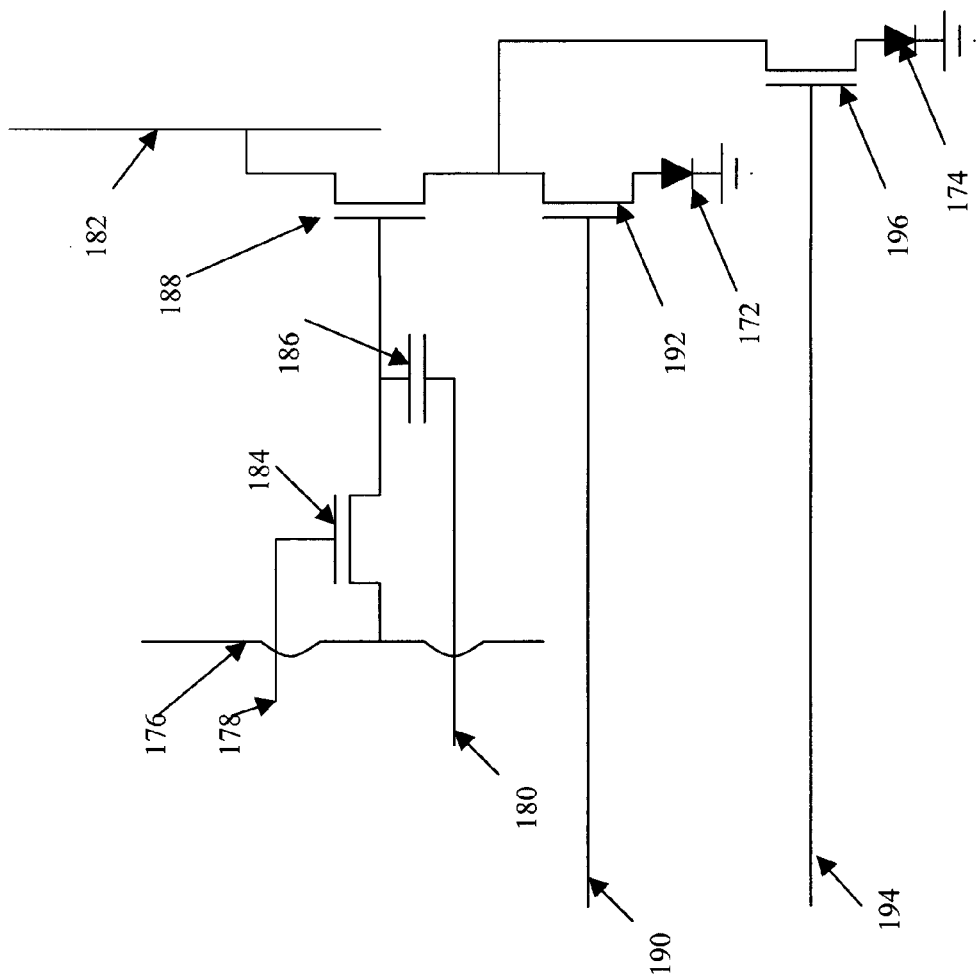
FIG. 8 is a circuit diagram for a circuit useful in providing power to a pair of light-emitting elements of the present invention

Other active-matrix circuits can also be employed in electro-luminescent displays of the present invention. One such circuit is shown in FIG. 8. This circuit provides power to a light-emitting element 172 within the first array of light-emitting elements as well as to a light-emitting element 174 within the second array of light-emitting elements. This circuit includes similar elements for providing power to the two light-emitting elements 92, 94 within FIG. 6. That is, the circuit includes one select row line 178 for activating the gate of the thin-film transistor 184 to allow the data signal from the column line 176 to charge the capacitor 186, and in turn open the gate of thin film transistor to allow power to flow from the power line 182 towards the light-emitting elements. Also shown is a capacitor line 180 to modify the voltage at the capacitor 186. However, unlike previously discussed circuits, the circuit of FIG. 8 includes two additional row lines 190, 194. When a voltage is applied to one of these two row lines, the respective thin film transistor 192, 196 is activated, allowing power to flow from thin film transistor 188 through to the light-emitting elements. Note that if a signal is not applied to either row line 190 or 194, the light-emitting elements will not be activated. However, if a signal is applied simultaneously to both row lines 190 and 194, both light-emitting elements are activated. Therefore, as shown, FIG. 8 provides a common, active-matrix circuit to drive the light-emitting elements 172, 174 within the first or second array of light-emitting elements in response to a select signal. Further this circuit can be employed to drive both light-emitting elements 172, 174 within the first and second array simultaneously.

Figure 9:
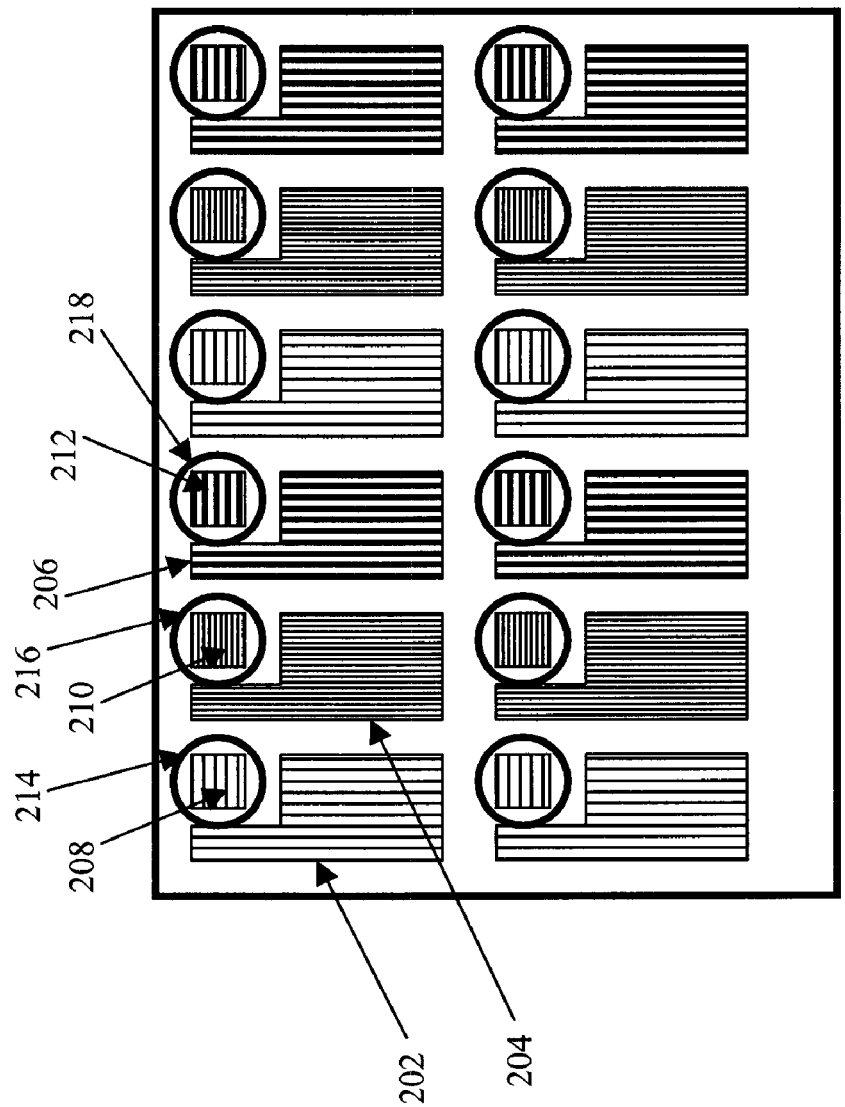
FIG. 9 is a schematic diagram depicting an arrangement of light-emitting elements and lenses useful in practicing the present invention.

FIG. 9 shows a plan view of a display having two-dimensional micro-lenses for a display back plane layout similar to the one shown in FIG. 7. As shown in FIG. 9, the display can be a full-color display that includes at least three colors of light-emitting elements. In this example, light-emitting elements are present for emitting red light 202, green light 204, and blue light 206, where each of these light-emitting elements are within the second array of light-emitting elements. Additionally, a first array of light-emitting elements is also provided, for emitting red light 208, green light 210, and blue light 212. The light-emitting elements within the first array of light-emitting elements emit light through lens elements 214, 216, and 218. Notice that these lenses are two-dimensional lenses and have optical power in both the horizontal and vertical dimensions.

Figure 10:
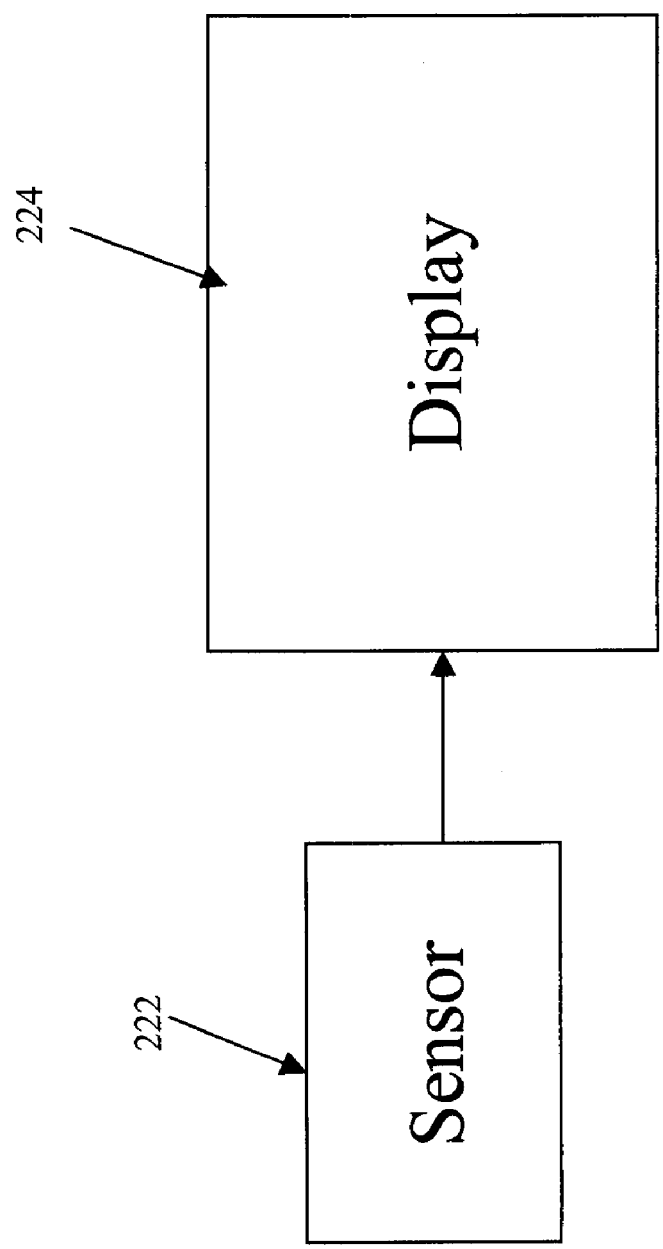
FIG. 10 is a schematic diagram of a display system employing a sensor in combination with a display of the present invention.

When switching among the modes of operation, including the first, second and third modes of operation, a selection signal 43 will typically be provided to the driver circuit 40 to indicate a need for mode change. This selection signal 43 can originate from many sources, including input from the user through the activation of a virtual or physical button. However, the system can rely upon other sensors that are present within the system or embedded in the display. FIG. 10 shows one such sensor 222 for transmitting a signal to the display 224. Sensors that are of use can include orientation, proximity sensors, or ambient sensors. It is known that displays often require a larger horizontal field of view than a vertical field of view. The orientation sensor simply indicates which dimension of the display is in fact oriented horizontally and the display 224 switches among the modes to provide a desirable horizontal field of view. Sensors, such as proximity sensors provide information regarding the location of the user's head with respect to the display and the display switches among modes to insure that the user receives an adequate image, regardless of head position. Sensors, such as ambient light sensors determine the ambient light level and switch among the modes to provide increased on-axis luminance in high ambient light environments, as compared to ambient light environments, which provide a lower level of illumination on the display.

The optical elements 14, 16 of the present invention can include any known optical elements for directing at least the light from one of the light-emitting elements within the array into a viewing cone that is different from the viewing cone of other light-emitting elements. As discussed, these optical elements are formed from traditional lenses. They can alternatively be formed from reflective structures, such as mirrors. Other diffractive or refractive elements can also be employed. Typically, these optical elements will have a fixed optical power. However, optical elements are also employed that have a variable optical power, including polarization-activated microlenses or active lenses, as described by Woodgate and Harrold in the Society for Information Display Journal article entitled, "Efficiency analysis of multi-view spatially multiplexed autostereoscopic 2-D/3D displays".

The electro-luminescent display can be any electro-luminescent display used to form a two-dimensional array of addressable light-emitting elements. These devices include electro-luminescent layers 26 employing purely organic small molecule or polymeric materials, typically including organic hole transport, organic light-emitting and organic electron transport layers as described in the prior art, including U.S. Pat. No. 4,769,292, issued Sep. 6, 1988 to Tang et al., and U.S. Pat. No. 5,061,569, issued Oct. 29, 1991 to VanSlyke et al. The electro-luminescent layer 26 can alternately be formed from a combination of organic and inorganic materials, typically including organic hole transport and electron transport layers in combination with inorganic light-emitting layers, such as the light-emitting layers described in U.S. Pat. No. 6,861,155 issued Mar. 1, 2005 to Bawendi et al. Alternately, the electro-luminescent layer 26 can be formed from fully inorganic materials such as the devices described in co-pending U.S. Ser. No. 11/226,622 filed Sep. 14, 2005, entitled "Quantum Dot Light Emitting Layer".

The conductive layers forming the electrodes for the light-emitting element will commonly include at least one transparent or semi-transparent electrode and often one highly reflective electrode. However, both electrodes can be formed from transparent or semi-transparent materials. Commonly used reflective electrodes are often formed from metals such as aluminum, silver, or copper but can also be formed from multi-layers or mixtures of these metals with other high work function metals, such as magnesium or lithium. Commonly used transparent electrodes often include an oxide, such as indium tin oxide or indium zinc oxide. Semitransparent electrodes can be formed from very thin layers of metal or bilayers of thin metal in combination with a transparent oxide. Often the cathode will be formed of a material having a higher work function than the anode.

The substrate can also be formed of almost any material that provides mechanical support. When the transparent or semi-transparent electrode is formed directly on the substrate, it is desirable for the substrate to be formed from a transparent material, such as glass or clear plastic. Otherwise, the substrate can be either transparent or opaque. Although not shown, such displays generally will include additional layers for mechanical, oxygen, and moisture protection. Methods of providing this type of protection are well known in the art.

The lens arrays of the present invention can be formed out of one of several materials, including glass or polymeric materials, which can be etched, milled, imprinted, or cured to form optical micro-lenses. It is common to imprint optical structures into sheets of plastic to form such lenses.

Although, the current invention has been discussed specifically for electro-luminescent displays, the present invention can be usefully employed with alternate display technologies. Particularly any emissive display technology, including field emission or surface-conduction-electron-emitter displays, can benefit from aspects of the present invention.

The invention has been described in detail with particular reference to certain preferred embodiments thereof, but it will be understood that variations and modifications can be effected within the spirit and scope of the invention.

PARTS LIST 2 display
4 light-emitting element within the first array of light-emitting elements
6 light-emitting element within the second array of light-emitting elements
8 row line
10 row line
12 column line
14 lens element
16 surface
18 light-emitting element within the first array of light-emitting elements
20 substrate
22 conductive layer
24 insulating barrier layer
26 electro-luminescent layer
28 second conductive layer
30 air gap
32 patterned layer
34 second substrate
36 lenses
38 narrow cone of light
40 driver circuit
41 input image signal
42 light-emitting region
43 selection signal
44 column drivers
45 select signal
46 row drivers
47 signal for providing common information
48 display driver
50a first look-up table
50b second look-up table
52 select mode step
54 provide select signal step
56 provide signal step
58 deselect step
60 remove signal step
62 decide if new mode selected step
64 select each row line step
66 provide black signal step
68 deselect row step
70 decide if all rows disabled step
72 change mode step
82 first look-up table response
84 second look-up table response
92 light-emitting element within the first array of light-emitting elements
94 light-emitting element within the second array of light-emitting elements
96 column line
98 row line
100 row line
102 capacitor line
104 capacitor line
106 thin film transistor
108 thin film transistor
110 capacitor
112 capacitor
114 thin film transistor
116 thin film transistor
118 power line
120 power supply
122 power supply
124 switch
132 electrode
134 electrode
136 electrode
138 electrode
140 column line
142 column line
144 row line
146 capacitor line
148 row line
150 capacitor line
152 thin film transistor
154 thin film transistor
156 capacitor
158 capacitor
160 thin film transistor
162 thin film transistor
164 power line
166 power line
168 gap
172 light-emitting element
174 light-emitting element
176 column line
178 row line 180 capacitor line
182 power line
184 thin film transistor
186 capacitor
188 thin film transistor
190 row line
192 thin film transistor
194 row line
202 red light-emitting element
204 green light-emitting element
206 blue light-emitting element
208 red light-emitting element
210 green light-emitting element
212 blue light-emitting element
214 lens element
216 lens element
218 lens element
222 sensor
224 display

What is claimed is:

1. An electro-luminescent display, comprising:
a first array of light-emitting elements, each of the light-emitting elements comprising a first optical element;
a second array of light-emitting elements, each of the light-emitting elements comprising a second optical element different from the first optical element;
one or more row lines that are electrically connected to either light-emitting elements in the first array of light-emitting elements or to light-emitting elements in the second array of light-emitting elements;
one or more column lines configured to provide a data signal to the first and second array of light-emitting elements; and
a driver circuit configured to deliver common information to the light-emitting elements in both the first and second arrays in response to a selection signal for activating light-emitting elements in the first or second arrays.

2. The electro-luminescent display of claim 1, wherein at least one of the first and second optical elements comprises a lens configured to direct the light emitted from the light-emitting elements within the first or second array of light-emitting elements into a viewing cone which is narrower than a viewing cone produced by complementary optical elements.

3. The electro-luminescent display of claim 2, wherein the lens comprises an optical power along at least a horizontal and a vertical axis in a two-dimensional array.

4. The electro-luminescent display of claim 1, wherein the common information comprises a common color and relative luminance for light output by the light-emitting elements activated by the driver circuit.

5. The electro-luminescent display of claim 1, wherein the display comprises an active-matrix display; and
a common, active-matrix circuit is employed to drive light-emitting elements within the first and second arrays simultaneously.

6. The electro-luminescent display of claim 1, wherein:
the display comprises an active-matrix display; and
a common, active-matrix circuit is employed to drive the light-emitting elements within the first or second array of light-emitting elements in response to the selection signal.

7. The electro-luminescent display of claim 1, wherein each row line is connected to light-emitting elements for producing at least two colors of light.

8. The electro-luminescent display of claim 7, further comprising a single-dimensional array comprised solely of either the first or second array of light-emitting elements.

9. An electro-luminescent display, comprising:
a first array of light-emitting elements, each of the light-emitting elements comprising a first optical element;
a second array of light-emitting elements, each of the light-emitting elements comprising a second optical element different from the first optical element;
one or more row lines that are electrically connected to either light-emitting elements in the first array of light-emitting elements or to light-emitting elements in the second array of light-emitting elements;
one or more column lines configured to provide a data signal to the first and second array of light-emitting elements; and
a driver circuit configured to deliver common information to the light-emitting elements in both the first and second arrays in response to a selection signal for activating light-emitting elements in the first or second arrays,
wherein the driver circuit is further configured to select among the one or more row lines to operate the display in one of two modes of operation, comprising:
a first mode in which only the one or more row lines within the first array of light-emitting elements is selected, and
a second mode in which only the one or more row lines within the second array of light-emitting elements is selected.

10. The electro-luminescent display of claim 9, wherein the driver circuit is further configured to select all of the one or more row lines to operate the display in a third mode in addition to the first and second modes of operation.

11. The electro-luminescent display of claim 10, wherein:
the driver circuit updates the display with a first refresh rate when driving the display in either the first or second mode and a second refresh rate when driving the display in the third mode; and
the second refresh rate is lower than the first refresh rate.

12. The electro-luminescent display of claim 9, wherein:
the display is an active-matrix display, further comprising an array of power lines that are connected to one or more power supplies capable of providing at least two voltage levels; and
the power supply voltage is switched between the two voltage levels synchronously with switching between the two modes of operation.

13. The color electro-luminescent display of claim 9, wherein the display further comprises drive electronics that respond to a control signal that is generated by one or more sensors, comprising an orientation sensor, a proximity sensor capable of indicating viewer location, or an ambient light sensor.

14. An electro-luminescent display, comprising:
a first array of light-emitting elements, each of the light-emitting elements comprising a first optical element;
a second array of light-emitting elements, each of the light-emitting elements comprising a second optical element different from the first optical element;
one or more row lines that are electrically connected to either light-emitting elements in the first array of light-emitting elements or to light-emitting elements in the second array of light-emitting elements;
one or more column lines configured to provide a data signal to the first and second array of light-emitting elements; and a driver circuit configured to deliver common information to the light-emitting elements in both the first and second arrays in response to a selection signal for activating light-emitting elements in the first or second arrays, wherein light-emitting elements within the first and second arrays of light-emitting elements driven with the common information are not spatially resolvable from a viewing distance of four times the height of the display.

15. An electro-luminescent display, comprising:

a first array of light-emitting elements, each of the light-emitting elements comprising a first optical element;

a second array of light-emitting elements, each of the light-emitting elements comprising a second optical element different from the first optical element;

one or more row lines that are electrically connected to either light-emitting elements in the first array of light-emitting elements or to light-emitting elements in the second array of light-emitting elements;

one or more column lines configured to provide a data signal to the first and second array of light-emitting elements; and a driver circuit configured to deliver common information to the light-emitting elements in both the first and second arrays in response to a selection signal for activating light-emitting elements in the first or second arrays, wherein the row lines forming an electrical connection to the first array of light-emitting elements have a different electrical impedance from the row lines forming an electrical connection to the second array of light-emitting elements.

16. An electro-luminescent display, comprising:

a first array of light-emitting elements, each of the light-emitting elements comprising a first optical element;

a second array of light-emitting elements, each of the light-emitting elements comprising a second optical element different from the first optical element;

one or more row lines that are electrically connected to either light-emitting elements in the first array of light-emitting elements or to light-emitting elements in the second array of light-emitting elements;

one or more column lines configured to provide a data signal to the first and second array of light-emitting elements; and a driver circuit configured to deliver common information to the light-emitting elements in both the first and second arrays in response to a selection signal for activating light-emitting elements in the first or second arrays, wherein a radiant flux output by the first array of light-emitting elements is less than a radiant flux output by the second array of light-emitting elements.

17. An electro-luminescent display, comprising:

a first array of light-emitting elements, each of the light-emitting elements comprising a first optical element;

a second array of light-emitting elements, each of the light-emitting elements comprising a second optical element different from the first optical element;

one or more row lines that are electrically connected to either light-emitting elements in the first array of light-emitting elements or to light-emitting elements in the second array of light-emitting elements;

one or more column lines configured to provide a data signal to the first and second array of light-emitting elements; and a driver circuit configured to deliver common information to the light-emitting elements in both the first and second arrays in response to a selection signal for activating light-emitting elements in the first or second arrays, wherein the display is a passive-matrix display and the driver circuit provides a smaller current to the row and column lines when the driver circuit selects one or more row lines than when the driver circuit selects a row line within the second array of light-emitting elements.

18. An electro-luminescent display, comprising:

a first array of light-emitting elements, each of the light-emitting elements comprising a first optical element;

a second array of light-emitting elements, each of the light-emitting elements comprising a second optical element different from the first optical element;

one or more row lines that are electrically connected to either light-emitting elements in the first array of light-emitting elements or to light-emitting elements in the second array of light-emitting elements, each row line being connected to light-emitting elements for producing at least two colors of light;

one or more column lines configured to provide a data signal to the first and second array of light-emitting elements; and a driver circuit configured to deliver common information to the light-emitting elements in both the first and second arrays in response to a selection signal for activating light-emitting elements in the first or second arrays; and a single-dimensional array comprised solely of either the first or second array of light-emitting elements, wherein the light-emitting elements, within the single-dimensional array, share a common micro-lens having optical power in the axis perpendicular to the single-dimensional array across the display.

19. A color electro-luminescent display, comprising:

a two-dimensional array of two or more colors of electro-luminescent light-emitting elements, arranged to be intermixed along a first dimension that is perpendicular to a second dimension; and an array of lenses arranged parallel to the electro-luminescent light-emitting elements in the first dimension and said arrangement of lenses employs fewer lenses than light-emitting elements when perpendicular to the first dimension.

20. The electro-luminescent display of claim 19, wherein the array of two or more colors forms stripes of a common color perpendicular to the first dimension.

* * * * *